(12) United States Patent
Basel et al.

(10) Patent No.: US 8,941,001 B1
(45) Date of Patent: Jan. 27, 2015

(54) TRANSPARENT LAYER WITH ANTI-REFLECTIVE TEXTURE

(75) Inventors: Louis Basel, The Hague (NL); Robert Stancel, Berlin (DE); Christian Fessenmaier, Mountain View, CA (US)

(73) Assignee: aeris CAPITAL Sustainable IP Ltd., Grand Cayman (KY)

( * ) Notice: Subject to any disclaimer, the term of this patent is extended or adjusted under 35 U.S.C. 154(b) by 39 days.

(21) Appl. No.: 12/948,732

(22) Filed: Nov. 17, 2010

Related U.S. Application Data

(60) Provisional application No. 61/262,143, filed on Nov. 17, 2009.

(51) Int. Cl.
*H01L 31/0236* (2006.01)
*H01L 31/0216* (2014.01)

(52) U.S. Cl.
CPC ............................ *H01L 31/02168* (2013.01)

USPC ................................................ 136/256

(58) Field of Classification Search
CPC ............... H01L 31/00; H01L 31/0236; H01L 31/02366
USPC .......................... 136/246, 256, 259
See application file for complete search history.

(56) References Cited

U.S. PATENT DOCUMENTS

| | | | |
|---|---|---|---|
| 2005/0039788 A1* | 2/2005 | Blieske et al. | 136/246 |
| 2007/0240754 A1* | 10/2007 | Gayout et al. | 136/246 |

* cited by examiner

*Primary Examiner* — Jonathan Johnson
*Assistant Examiner* — Christina Chern
(74) *Attorney, Agent, or Firm* — Joshua D. Isenberg; JDI Patent

(57) ABSTRACT

Methods and devices are provided for improved anti-reflective texture. In some embodiments, the absorber layer for use with this anti-reflective layer is a group IB-IIIA-VIA absorber layer.

10 Claims, 3 Drawing Sheets

TRANSPARENT LAYER WITH ANTI-REFLECTIVE TEXTURE

CROSS-REFERENCE TO RELATED APPLICATIONS

This application claims priority to U.S. Provisional Application Ser. No. 61/262,143 filed Nov. 17, 2009 and fully incorporated herein by reference for all purposes.

FIELD OF THE INVENTION

This invention relates generally to textured transparent material. More specifically, it relates to anti-reflective glass panel for photovoltaic devices and/or modules.

BACKGROUND OF THE INVENTION

Anti-reflective or antireflection (AR) texture is designed to reduce reflection at an optical interface, thus potentially increasing light absorbance beyond that interface. The performance of these AR textures on material such as glass, however, is dependent on a variety of factors including but not limited to repeatability of the pattern in high throughput manufacturing, temperability of the pattern, and cleanability of the pattern when used in the field.

SUMMARY OF THE INVENTION

Embodiments of the present invention address at least some of the drawbacks set forth above. In some embodiments, the present invention provides for the use of textured glass that is raised and/or in relief to improve light capture of glass or other transparent material used for photovoltaic devices. In some embodiments, the present invention provides for the use of sol-gel based chemical processes to form an anti-reflective coating on the textured transparent plate. This may be used with rigid substrates and/or flexible substrates. At least some of these and other objectives described herein will be met by various embodiments of the present invention.

In one embodiment of the present invention, a device is provided comprising a repeating rhomboid pattern, wherein each of the sides of the rhomboid are at an angle between about 30 to 60 degrees from horizontal, wherein the center ridge line of the rhomboid is less than about ⅕ of the length of the entire rhomboid. Optionally, the center ridge line of the rhomboid is less than about ⅓ of the length of the entire rhomboid. Optionally, the center ridge line of the rhomboid is less than about ¼ of the length of the entire rhomboid. Optionally, the center ridge line of the rhomboid is less than about ⅕ of the length of the entire rhomboid. Optionally, the pattern is one without a straight linear cleave line across at least ½ the width of the transparent plate. Optionally, the pattern is one without a straight linear cleave line across at least ⅓ the width of the transparent plate.

It should be understood that embodiments of the present invention may modified to include one or more of the following features. In one embodiment, the plate includes a multi-layer anti-reflective coating has a graded index of refraction. Optionally, each of the nanostructured layers has a different index of refraction. Optionally, the porosity of each layer is different from the porosity in any other layer to alter an index of refraction for that layer. Optionally, the nanostructured porous layers define a three-dimensional porous network that provides an optical path which captures most of the visible light which enters the network. Optionally, the three-dimensional porous network increases light transmission through the substantially transparent substrate to an underlying photovoltaic absorber layer. Optionally, light collection is at least 95% of incoming light in wavelengths between about 300 nm to about 1300 nm. Optionally, light collection is at least 90% of incoming light in wavelengths between about 300 nm to about 1300 nm. Optionally, light collection is at least 85% of incoming light in wavelengths between about 300 nm to about 1300 nm. Optionally, light collection is at least 95% of incoming light in wavelengths between about 400 nm to about 1600 nm. Optionally, light collection is at least 90% of incoming light in wavelengths between about 400 nm to about 1600 nm. Optionally, light collection is at least 85% of incoming light in wavelengths between about 400 nm to about 1600 nm. Optionally, the multilayer anti-reflective coating is conformal to the substrate. Optionally, pores are filled with a pore-filling material to define nanostructures in the nanostructured porous layers. Optionally, pores are filled with a pore-filling material to define nanowires in the nanostructured porous layers. Optionally, pores in at least one of the layers are filled with a transparent pore-filling material. Optionally, pores in at least one of the layers are filled with one of the following: titania (TiO2), organic material, dyes, pigments, or conjugated polymers. Optionally, at least some of the nanostructured porous layers are made of different material. Optionally, a top nanostructured porous layer of the multi-layer anti-reflective coating comprises of a different material than a bottom nanostructured porous layer. Optionally, a top nanostructured porous layer of the multi-layer anti-reflective coating comprises of a silica and a bottom nanostructured porous layer comprises of titania. Optionally, a top nanostructured porous layer of the multi-layer anti-reflective coating comprises of a titania and a bottom nanostructured porous layer comprises of silica. Optionally, each of the nanostructured porous layer is made of at least one of the following: titania (TiO$_2$), silica (SiO$_2$), zinc oxide (ZnO$_2$), alumina, zirconium oxide, lanthanum oxide, niobium oxide, tungsten oxide, tin oxide, indium oxide, indium tin oxide (ITO), strontium oxide, vanadium oxide, molybdenum oxide, calcium/titanium oxide, or blends of two or more such materials. Optionally, the layers include nanostructured, self-assembled pores in the size range of about 5 nm to about 400 nm. Optionally, pores are between about 2 nm and about 500 nm in diameter, or between about 40 nm and about 100 nm in diameter or between about 10 nm and about 30 nm in diameter. Optionally, the pores comprise of tubule pores that have an average diameter between about 1 nm and about 200 nm or between about 1 nm and about 100 nm, or between about 10 nm and about 50 nm, or between about 20 nm and about 40 nm or about 30 nm. Optionally, the anti-reflective coating is formed on one or more of the following: glass, a transparent flexible substrate, a polymer substrate, soda lime glass, solar glass, tempered solar glass, tempered glass, untempered glass, a glass-foil solar module, a glass-glass solar module, a transparent rigid substrate, a transparent flexible substrate, a flexible module, or combinations of the foregoing. Optionally, a surface protecting layer is provided over the multi-layer anti-reflection coating. Optionally, a UV absorber is provided over the multi-layer anti-reflection coating. Optionally, a moisture resistance and scratch resistance layer is included. Optionally, a fluorine resin is laminated to the anti-reflection coating as a surface protecting layer. Optionally, the device further comprises at least one of the following in conjunction with the anti-reflective coating: nitrides, oxides, oxynitrides or other inorganic materials that protect against exposure to water or air. Optionally, the device further comprises an encapsulant having a multi-layer stack or a foil comprising a multi-layer stack of organic materials with inorganic dielectrics, wherein the encapsulant is in contact with the anti-reflective coating. Optionally, the device further comprises a group IB-IIIA-VIA photovoltaic absorber layer positioned to receive light from the transparent substrate.

In another embodiment of the present invention, an assembly comprising a textured transparent panel and a photovoltaic cell or solar collector element configured to collect light, said panel being textured on at least one of its faces by a plurality of raised rhomboid geometrical features with respect to a general plane of said face, the textured face increasing light transmission of the panel and being placed on a side on which the light is received, a surface of said features each having at least a raised ridge line.

Optionally, the raised ridge line is the highest feature of the textured surface. Optionally, the panel has touching features. Optionally, the panel has completely touching features. Optionally, a bulk of the panel essentially consists of materials whose linear absorption is less than 0.01 mm-1 within the spectrum ranging from 380 to 1200 nm. Optionally, the bulk of the panel essentially consists of a glass having a linear absorption of less than 0.008 mm-1 within the spectrum ranging from 380 to 1200 nm. Optionally, the distance between the panel and the element is less than 15 cm. Optionally, the distance between the panel and the element is less than 3 cm. Optionally, the distance between the panel and the element ranges from 0 to 10 mm. Optionally, the distance between the panel and the element ranges from 0 to 5 mm.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for an anti-reflective film, this means that the anti-reflective film feature may or may not be present, and, thus, the description includes both structures wherein a device possesses the anti-reflective film feature and structures wherein the anti-reflective film feature is not present.

In one embodiment, the transparent panel material includes on at least one of its surfaces, a texturing comprised of a plurality of geometrical features in relief and/or as raised features above the surface of the transparent material. For those features in relief, the features are pressed into the material, where as in a raised pattern, the features are formed to rise above the flat surface or plane of the transparent material. Both sides of the panel may have such features. It should be understood that the term "antireflection" includes a reduction in reflection (and not necessarily the complete absence of reflection). The panel according to embodiment of the present invention provides good light transmission whatever the orientation of the incident light.

There are two principles whereby the textured transparent panel according to the invention allows the transmission to be increased. Firstly, the reduction in reflection on its textured face is obtained by multiple reflections on the surface, which offer the light a greater opportunity to enter the panel. In addition, the light has smaller angles of incidence on the faces of the features for light rays which would have had high angles of incidence on a plane surface. Secondly, the light reflected after it enters the panel is trapped by reflection on the faces of the features and a larger portion of the light is transmitted through the panel. The reflection losses are thus much smaller.

Figure 1:
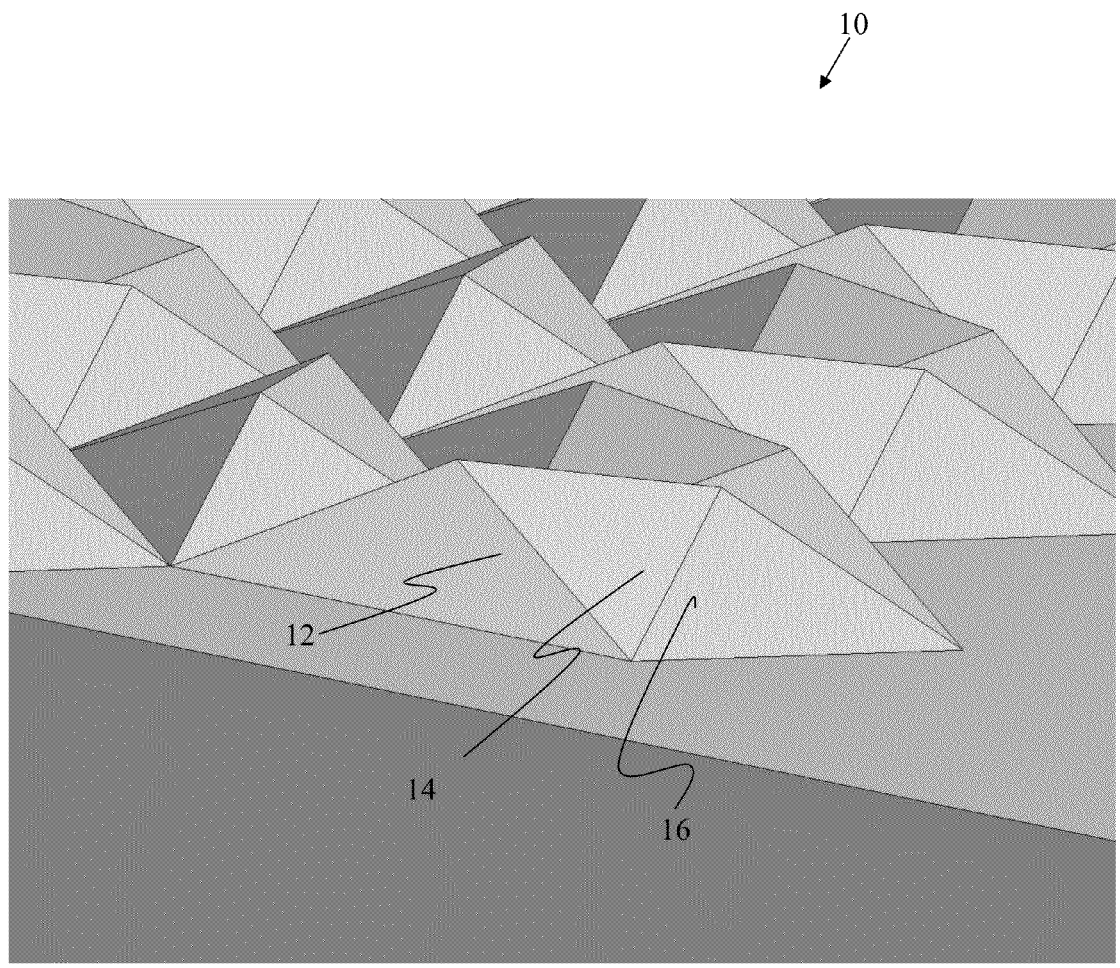
FIG. 1 is perspective view of one pattern according to one embodiment of the present invention.

Referring now to FIG. 1, a first geometric pattern 10 is shown comprised of a pattern of rhomboids. The rhomboid shape of each feature allows for the various faces of the rhomboid to more effectively direct light at angles which improve the likelihood of entry into the transparent panel.

Figure 2:
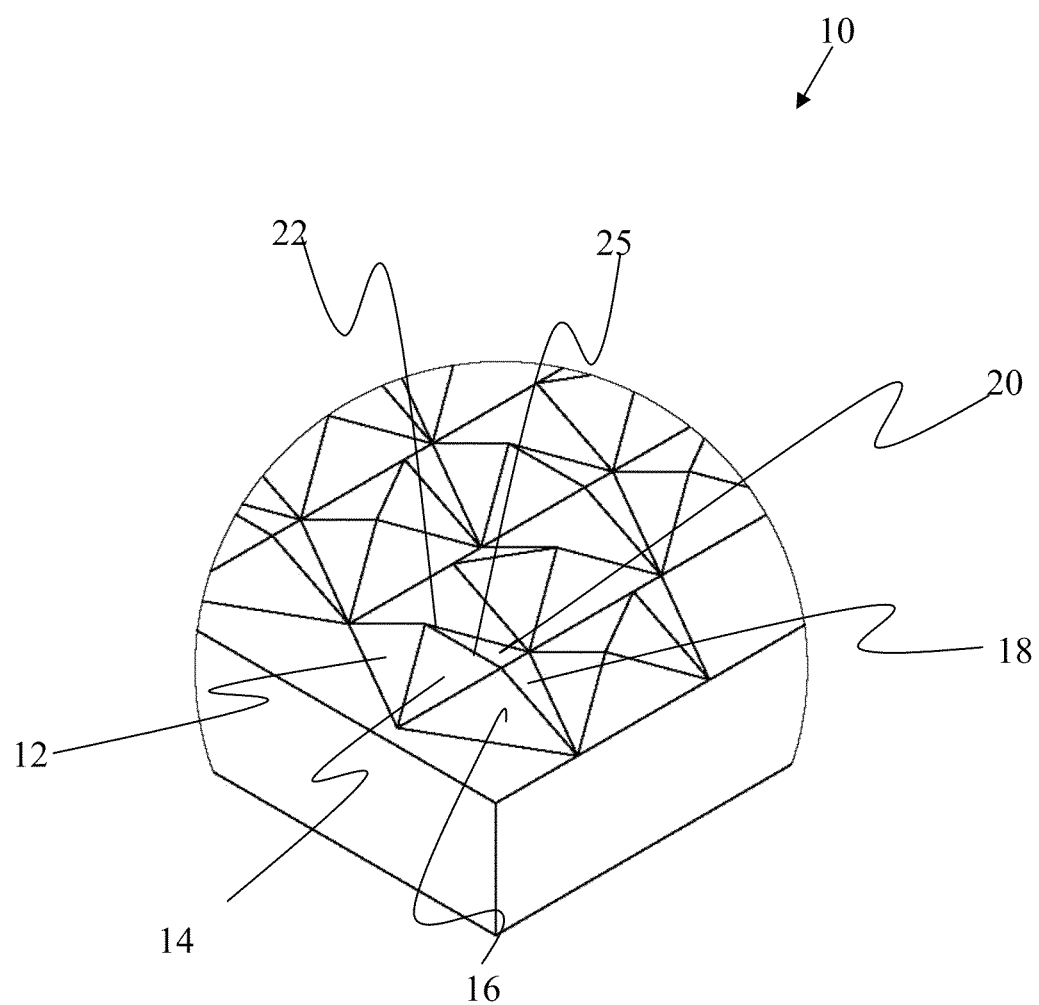
FIG. 2 is perspective view of one pattern according to one embodiment of the present invention.

Referring now to FIG. 2, the rhomboids include six angled edge face surfaces 12, 14, 16, 18, 20, and 22. Surface 22 is facing away in the view of FIG. 2 and is not as clearly shown. The angles of each of the faces relative to horizontal may be in the range of about 30 degrees to 60 degrees, with the steep the face, the better for anti-reflection purposes. Optionally, the faces relative to horizontal may be in the range of about 30 degrees to 70 degrees from horizontal. Optionally, the faces relative to horizontal may be in the range of about 30 degrees to 80 degrees from horizontal. The rhomboid pattern all provides fewer "apex" features, but instead including a ridge line 25 as the highest feature for each pattern. Of course in those embodiments when formed in relief, the ridge lines would be the lowest features.

The orientation of the ridge lines 25 in a radial pattern also allows for tempering of the glass in a manner that will minimize any bowing due to faster cooling of the raised features. If all of the ridge lines 25 were oriented in a parallel, such cooling may have a bending/bowing quality, and when all the ridgelines are in the same direction, the bowing will become additive and cause the entire plate to bow. When the ridge lines are short in aspect ratio relative to the overall rhomboid and are also oriented in non-parallel manner as presently shown, this creates a pattern that is more resistant to bowing, which is of particular importance in creating flat glass suitable for solar panel manufacturing. Preferably, the ridge line 25 is shorter in length than other line features of the rhomboid. Optionally, the ridge line 25 is longer in length than other line features of the rhomboid. Optionally, the ridge line 25 is equal in length than other line features of the rhomboid.

The orientation of the rhomboid in a concentric repeating pattern also provides for a locally strong pattern. There is no straight line where the thickness continued covering the whole width or length of a small pane more nearly locally than immediately near thickness (a true slot is constituted). Since there is no slot or straight line which makes a pane thin locally, local weakening of a pane is avoided. This pattern may be used tempered or untempered glass.

Figure 3:
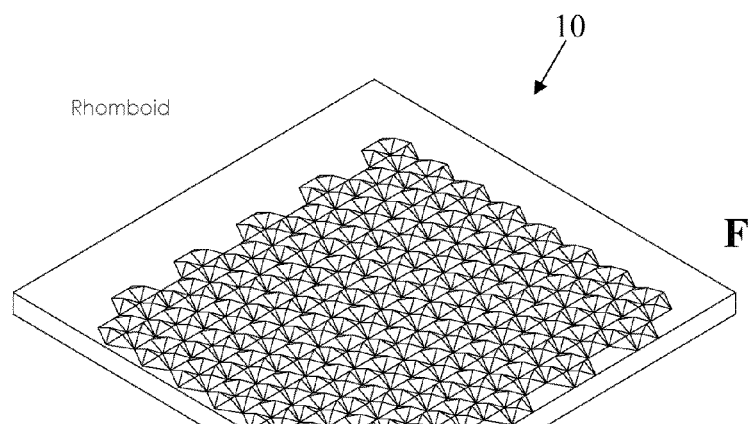
FIG. 3 is perspective view of one pattern according to one embodiment of the present invention.
Figure 5:
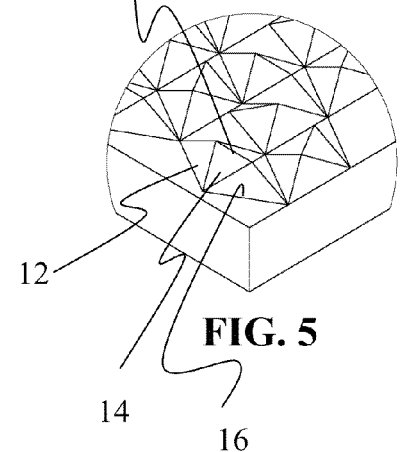
FIG. 5 is a perspective view of a pattern according to an embodiment of the present invention.
Figure 4:
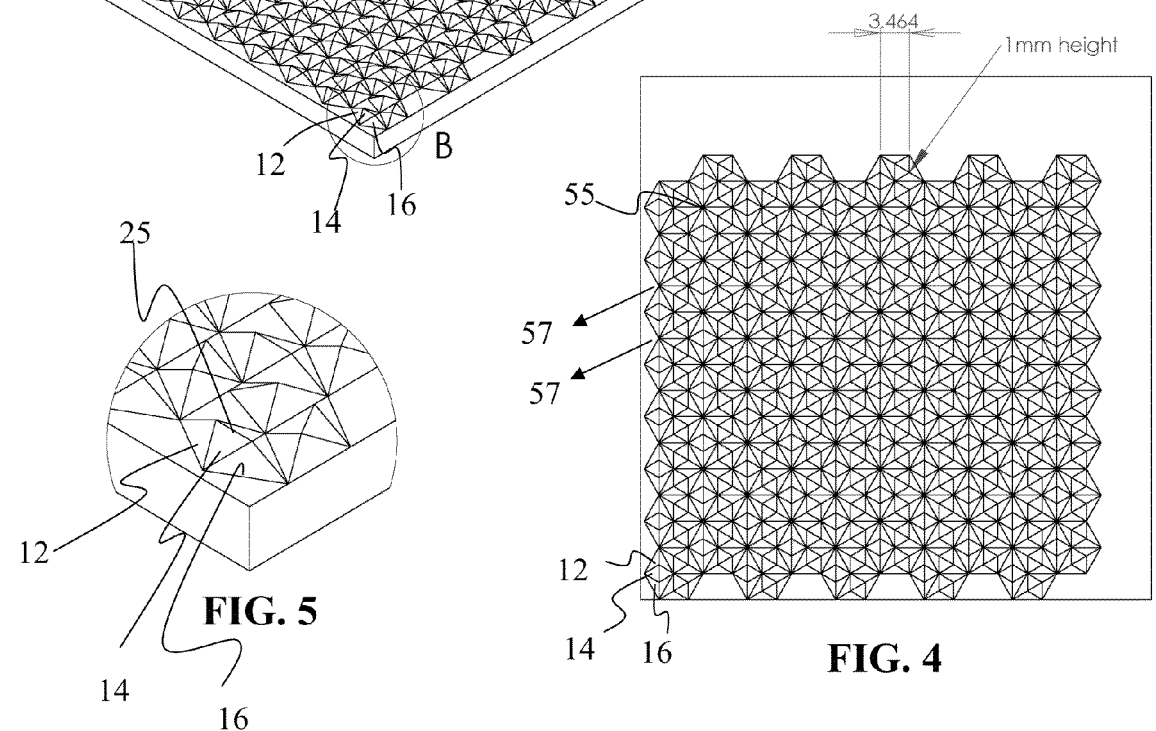
FIG. 4 is a plan view of a pattern according to an embodiment of the present invention.

Referring now to FIGS. 3, 4, and 5, it should also be understood that the presently shown texture pattern is also advantageous in that there are no long, straight cleave lines in the pattern. Cleave lines are areas of stress concentration typically in the "valley" area of a raised pattern wherein the glass is more likely to break when under load. In this manner as seen in FIGS. 3 and 4, the lines tracing the valley areas between the raised rhomboids are a plurality of alternating zig-zag patterns that are more resistant to breakage and thus allow the transparent plate to carry more load. Those patterns with long cleave lines allow of stress from more area of the plate to act along those lines in manner that causes breakage under lesser loads relative to those with zig-zag or non-straight line patterns. It should be understood that some embodiment the pattern covers the entire glass layer. Optionally, some may have a partial pattern that ends before the edge of the glass in a uniform manner around the perimeter of the glass.

As seen in the embodiment of FIG. 4, in this embodiment, the low center point 55 of a plurality of rhomboids oriented in a radial, sunburst pattern is in the center of such sunburst. The center points 55 of adjacent patterns are in diagonal, parallel straight lines as indicated by arrows 57.

In one embodiment, the panel may be made entirely of glass. It may also be a thermoplastic polymer, such as but not limited to a polyurethane or a polycarbonate or a polymethyl methacrylate. It may also be made of two materials, for example by combining a glass panel, both surfaces of which are plane and parallel, with a sheet or film of a polymer bearing the features in relief and fastened to said glass panel. In the case of this kind of glass/polymer combination, the polymer may be adhesively bonded to the glass, preferably with an adhesive having a refractive index close to that of the glass and of the polymer, which may especially be between 1.5 and 1.54.

Optionally, some embodiments may create the current pattern as "indentations" into the surface of the glass. In such embodiments, instead of creating raised rhomboids, inverted rhomboids are formed where the ridge line 25 is the lowest feature of each rhomboid.

In one embodiment, most of the mass (that is to say in the case of at least 98% by weight), or even all of the mass, of the panel consists of material(s) having the best possible transparency and preferably having a linear absorption of less than 0.01 mm$^{-1}$ in that part of the spectrum useful for the application, generally the spectrum ranging from 380 to 1200 nm. This is particularly the case when the panel is made of such a material, if necessary provided with one or more thin layers of the diffusing or barrier type at certain wavelengths or thin layers which are antifouling or conducting, these being described in greater detail below. Preferably, this linear absorption is lower the greater the thickness of material, in order to maintain the highest possible light transmission.

When glass is used in making up the composition of the panel, it is preferred to use an extra-clear glass, that is to say a glass having a linear absorption of less than 0.008 mm$^{-1}$ within the wavelength spectrum ranging from 380 to 1200 nm. Thus, if the panel comprises a glass, preferably has a linear absorption of less than 0.008 mm$^{-1}$ within the wavelength spectrum ranging from 380 to 1200 nm. Most of the mass of the panel (that is to say at least 98% by weight), or all of the mass, may consist of such a glass. This is especially the case when the panel consists of such a glass, where appropriate provided with one or more thin layers of the diffusing or barrier type at certain wavelengths or thin layers that are antifouling or conducting, these being described in detail below.

The glass panel according to the invention may have a total thickness ranging from 0.1 to 10 mm. When this is used as a protective panel for a photoelectric cell, the glass panel may have has a total thickness ranging from 2 to 6 mm. Optionally, the glass panel may have a total thickness ranging from 1.5 to 4.5 mm. In one embodiment, the pattern may comprise of about 1 mm of the depth while the unpatterned portion is about 3 mm. In one embodiment, the percentage of pattern depth may be about 35% or less. In one embodiment, the percentage of pattern depth may be about 30% or less. In one embodiment, the percentage of pattern depth may be about 25% or less. In one embodiment, the percentage of pattern depth may be about 20% or less. In one embodiment, the glass is patterned with at least pattern depth of about 20%, but still able to handle a load of about 2400 pa. In one embodiment, the glass is patterned with at least pattern depth of about 25%, but still able to handle a load of about 2400 pa. In one embodiment, the glass is patterned with at least pattern depth of about 30%, but still able to handle a load of about 2400 pa. In one embodiment, the glass is patterned with at least pattern depth of about 35%, but still able to handle a load of about 2400 pa.

The panel according to the invention may be provided with an antireflection coating placed on the side with the textured surface and/or on the side with the untextured surface. Such an antireflection coating may for example be like that described in U.S. application Ser. No. 12/267,818 filed Nov. 10, 2008 (fully incorporated herein by reference for all purposes) and obtained in a manner known to those skilled in the art, for example by being deposited on the glass.

The texturing may be carried out by rolling (or casting), thermoforming or etching, especially laser etching in the case of a polymer material. In the case of texturing a glass surface, the rolling process is particularly suitable. For this process, the texturing is applied to the plane surface of a glass heated to a temperature at which it is possible to deform its surface using a solid object such as a metal roll whose surface has the reverse shape of the texturing to be formed.

Depending on the shape of the intended texturing, this process may not necessarily lead to perfect geometrical shapes. Especially in the case of pyramids, the apex and the edges of the pyramid may be rounded. The rhomboid pattern 10 is comprised of ridges, but no apex features. Due to some rolling related issues, one side of the pattern may be more sharply angled (say at 60 degrees), while the other side more shallowly angled (say 30 degrees). Thus, in some embodiments, the asymmetric rhomboid patterns may be created to have at least one side that is more steeply angled. In one embodiment, this more steeply angled side is along the latitudinal axis of the plate. Optionally, in other embodiments, this more steeply angled side is along the longitudinal axis of the plate. Some embodiments may use a roller with an asymmetric pattern that is opposite of the pattern described so as to "cancel" out the asymmetry by having an opposing asymmetry in the roller. Thus, the side in the glass that would otherwise have a more steeply angled face would now be matched with an roller pattern that would normally created a shallower angle in the glass and vice versa for the shallow side. This can be employed to create a more symmetrical final pattern in the glass.

In one embodiment, a panel according to the invention may be produced from an extra-clear flat glass, having a linear absorption of less than $8 \times 10^{-3}$ mm$^{-1}$ over the wavelength spectrum ranging from 380 to 1200 nm and a thickness of 4 mm, by producing, on this plate, by rolling at its deformation temperature, a concave texturing composed of an assembly of touching square-based pyramids with the following dimensions: 0.5 mm for each side of the base and an apex half-angle of 45 degree, the total thickness of the panel remaining 4 mm after texturing.

In one embodiment, a panel according to the invention may be produced from an extra-clear flat glass, having a linear absorption of less than $8 \times 10^{-3}$ mm$^{-1}$ over the wavelength spectrum ranging from 380 to 1200 nm and a thickness of 3.2 mm, by producing, on this plate, by rolling at its deformation temperature, a concave texturing composed of an assembly of touching square-based pyramids with the following dimensions: 0.5 mm for each side of the base and an apex half-angle of 45 degree, the total thickness of the panel remaining 3.5 mm after texturing.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, although glass is the layer most often described as the top layer for the module, it should be understood that other material may be used and some multi-laminate materials may be used in place of or in combination with the glass. Some embodiments may use flexible top layers or coversheets. By way of nonlimiting example, the backsheet is not limited to rigid modules and may be adapted for use with flexible solar modules and flexible photovoltaic building materials. Embodiments of the present invention may be adapted for use with superstrate or substrate designs. This application may also be applied without requiring further tempering of the clear substrate. The coatings may applied in one or more layers over a tempered glass, tempered solar glass, full modules, un-tempered glass, or other transparent rigid substrate. Optionally, there may be a carrier on which discrete or pre-cut substrates comprising the precursor layers may be placed. The carrier may then carry these discrete or pre-cut substrates through the processing station(s). As part of the initial setup, the surface of the substrate to be processed may be cleaned prior to solution deposition. Dip coating of the substrate, bath techniques, and/or other solution deposition processes may also be used. It should also be understood that hydrophobic and/or superhydrophobic material may be used over the AR coating to prevent any pores in the AR coating from being filled with water which will degrade the AR ability of the coating. Optionally, polymers such as those with index of refraction of 1.2 to 1.5 may be used to fill surface pores on the coating. Optionally, those with an index of refraction closer to 1.2 may be used. Some polymers with suitable index of refraction may include but are not limited to all low refractive index polymers are amorphous fluorinated polymers by their structure. Champion data in three categories were introduced. By calculation, a polymer of fluorovinylether has the lowest refractive index. Among copolymers on the market, Teflon AF of DuPont has the lowest index, whereas Sitop of Asahi Glass Co., Ltd. is the homopolymer of the lowest refractive index.

Furthermore, those of skill in the art will recognize that any of the embodiments of the present invention can be applied to almost any type of solar cell material and/or architecture. For example, the absorber layer in solar cell 10 may be an absorber layer comprised of silicon, amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, Cu(In,Ga)(S,Se)2, Cu(In,Ga,Al)(S,Se,Te)2, I-VI materials, IB-VI materials, CuZnTe, CuTe, ZnTe, other absorber materials, IB-IIB-IVA-VIA absorbers, and/or combinations of the above, where the active materials are present in any of several forms including but not limited to bulk materials, microparticles, nano-particles, or quantum dots. The CIGS cells may be formed by vacuum or non-vacuum processes. The processes may be one stage, two stage, or multi-stage CIGS processing techniques. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or C60 molecules, and/or other small molecules, microcrystalline silicon cell architecture, randomly placed nanorods and/or tetrapods of inorganic materials dispersed in an organic matrix, quantum dot-based cells, or combinations of the above. Many of these types of cells can be fabricated on flexible substrates. The substrate may be in the form of a commercially available sheet material such as but not limited to aluminum, steel, carbon steel, stainless steel, copper, Mo, or (C-, Au-, Ag-, Al-, or Cu-coated Steel Foil) or metal/alloy-coated plastic foils, including metal or metalized plastic substrates/foils that are planarized to reduce surface roughness.

Optionally, further improvements in AR function are possible by use of multilayer stacks that generate maximum destructive interference from the various surfaces within the stack. For example, a second quarter wavelength thick layer could be formed between a low index layer and another surface, where the reflections from three or more interfaces produce additional destructive interference. Mechanical etching at the nanoscale can create a rough surface which can function as an AR coating. For example, acid etching of soda lime glass can alter the index of refraction to around 1.27, due to the air pockets formed between the etched grooves and valleys in the glass. Optionally, more ordered nanostructured coatings can be used to approach an appropriately low refractive index where the coating material is thinned by air, so porosity is the tuning mechanism to achieve an optimum aggregate index of refraction. One approach to achieving this porosity is to sinter together similarly sized SiO2 nano-scale spheroids with a sol to promote inter-particle adhesion. Alternatively, a porous AR coating can be achieved with sols formed using aqueous systems with less than 1% organic components, where the AR properties are excellent, mechanical strength is high, and anti-abrasion properties are good. However, the coating formation process results in structural inhomogeneities as exemplified by streaking across the coated substrate, which can impact both the function and the appearance of the coated film. Optionally, another approach which may be combined with the present embodiments of the invention comprises using of two sizes of SiO2 nano-scale spheroids, where the smaller particles contribute both to an altered index of refraction and to good sintering (and thus uniform thickness with minimal streaking) due to the high chemical reactivity afforded by the high surface area to volume ration of very small particles (4-15 nm), and where the large particles contribute both to an altered index of refraction, to chemical Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An assembly comprising:
a textured transparent panel and a photovoltaic cell or solar collector element configured to collect light, said panel being textured on at least one of its faces by a plurality of raised rhomboid geometrical features with respect to a general plane of said face, wherein each of the raised rhomboid geometrical features in the plurality has six faces, the textured face increasing light transmission of the panel and being placed on a side on which the light is received, a surface of said features each having at least a raised ridge line, wherein the rhomboid geometrical features form a rhomboid pattern that includes ridges, but not apex features.

2. The assembly of claim 1 wherein the raised ridge line is highest of any raised features on the panel.

3. The assembly as claimed in claim 1, wherein the panel has touching features.

4. The assembly as claimed in claim 1, wherein the panel has completely touching features.

5. The assembly as claimed in claim 1, wherein a bulk of the panel essentially consists of materials whose linear absorption is less than 0.01 $mm^{-1}$ within the spectrum ranging from 380 to 1200 nm.

6. The assembly as claimed in claim 5, wherein the bulk of the panel essentially consists of a glass having a linear absorption of less than 0.008 $mm^{-1}$ within the spectrum ranging from 380 to 1200 nm.

7. The assembly as claimed in claim 1, wherein a distance between the panel and the element is less than 15 cm.

8. The assembly as claimed in claim 7, wherein the distance between the panel and the element is less than 3 cm.

9. The assembly as claimed in claim 8, wherein the distance between the panel and the element ranges from 0 to 10 mm.

10. The assembly as claimed in claim 9, wherein the distance between the panel and the element ranges from 0 to 5 mm.

* * * * *